(12) United States Patent
Horie et al.

(10) Patent No.: US 8,178,445 B2
(45) Date of Patent: May 15, 2012

(54) SUBSTRATE PROCESSING APPARATUS AND MANUFACTURING METHOD OF SEMICONDUCTOR DEVICE USING PLASMA GENERATION

(75) Inventors: Tadashi Horie, Toyama (JP); Akito Hirano, Toyama (JP); Tadashi Terasaki, Imizu (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 77 days.

(21) Appl. No.: 12/801,444

(22) Filed: Jun. 9, 2010

(65) Prior Publication Data

US 2010/0317199 A1   Dec. 16, 2010

(30) Foreign Application Priority Data

Jun. 10, 2009 (JP) ................................. 2009-139198
Jun. 9, 2010 (JP) ................................. 2010-131794

(51) Int. Cl.
*H01L 21/31* (2006.01)
(52) U.S. Cl. ........................................ 438/758
(58) Field of Classification Search ........................ None
See application file for complete search history.

(56) References Cited

U.S. PATENT DOCUMENTS

| | | | |
|---|---|---|---|
| 6,086,960 A | 7/2000 | Kim et al. | |
| 2002/0155219 A1 | 10/2002 | Wang et al. | |
| 2003/0067023 A1 | 4/2003 | Olewine et al. | |
| 2009/0130331 A1 | 5/2009 | Asai et al. | |

FOREIGN PATENT DOCUMENTS

| | | |
|---|---|---|
| JP | A-8-279558 | 10/1996 |
| JP | A-8-337875 | 12/1996 |
| JP | A-11-80965 | 3/1999 |
| JP | A-2000-195820 | 7/2000 |
| JP | A-2001-291682 | 10/2001 |
| JP | A-2005-505934 | 2/2005 |
| JP | A-2007-123934 | 5/2007 |
| JP | A-2008-288408 | 11/2008 |
| KR | 10-0798552 | 1/2008 |
| WO | WO 00/26952 | 5/2000 |
| WO | WO 2007/020874 A1 | 2/2007 |

OTHER PUBLICATIONS

Japanese Office Action issued in Japanese Application No. 2010-131794 on May 25, 2011 (with translation).
Korean Office Action issued in Korean Patent Application No. 10-2010-0054929 on Jul. 27, 2011 (with translation).

*Primary Examiner* — Scott B Geyer
(74) *Attorney, Agent, or Firm* — Oliff & Berridge, PLC

(57) ABSTRACT

A manufacturing method for a semiconductor device, that loads a substrate on which a film containing oxygen atoms, chlorine atoms, and metal atoms is formed into a processing chamber so as to be supported by a substrate support part. The substrate is heated by the substrate support part. The inside of the processing chamber is exhausted by a gas exhaust part while supplying nitrogen atoms-containing gas and hydrogen atoms-containing gas into the processing chamber by a gas supply part. A plasma generation part is then used to excite the nitrogen atoms-containing gas and the hydrogen atoms-containing gas supplied into the processing chamber.

15 Claims, 4 Drawing Sheets

| Film composition (%) | Nitrogen atoms | Oxygen atoms | Titanium atoms | Carbon atoms |
|---|---|---|---|---|
| Before processing | 29.2 | 26.9 | 29.5 | 14.4 |
| After processing | 37.1 | 19.4 | 32.5 | 11.0 |

SUBSTRATE PROCESSING APPARATUS AND MANUFACTURING METHOD OF SEMICONDUCTOR DEVICE USING PLASMA GENERATION

BACKGROUND OF THE INVENTION

1. Field of the Invention

The present invention relates to a substrate processing apparatus for processing a substrate by using plasma and a manufacturing method of a semiconductor device.

2. Description of the Related Art

In a semiconductor logic device and a DRAM device, etc, for example, a metal nitride film (simply called a titanium nitride (TiN) film hereafter) containing titanium nitride is used as materials of an electrode and wiring, etc, for inhibiting an increase of an electric resistance associated with microfabrication of the device. The metal nitride film can be formed by, for example, Chemical Vapor Deposition (CVD) and Atomic Layer Deposition (ALD). Titanium tetrachloride ($TiCl_4$) gas containing chlorine is used as a precursor gas, to form the titanium nitride film by such methods. For example, patent document 1 describes a method of forming the titanium nitride film.

(Patent document 1) WO/2007/020874 Pamphlet

However, after study of the inventors of the present invention, it is found that when the titanium nitride film is formed by the aforementioned method, impurities such as chlorine atoms and carbon atoms are remained in a film. Particularly, when the titanium tetrachloride is used as the precursor gas, residue of the chlorine atoms in the titanium nitride film is remarkable. The residue of the chlorine atoms and carbon atoms causes the electric resistance of the titanium nitride film to be increased.

The chlorine atoms can be removed by forming the titanium nitride film at a high temperature or by carrying out high heat treatment after the titanium nitride film is formed. However, for example, when the high heat treatment is applied to the titanium nitride film formed as an upper electrode and a lower electrode of a capacitor of DRAM, characteristics of a capacitor insulating film sandwiched between titanium nitride films is deteriorated and a leak current is increased in some cases. Further, diffusion occurs in a source region and a drain region which are previously formed in the substrate, thus deteriorating the circuit characteristics and reducing a performance of a semiconductor device in some cases. Meanwhile, when the chlorine atoms are removed in a temperature range in which the deterioration of the aforementioned characteristics and diffusion are not generated, it is difficult to sufficiently remove the residual chlorine.

Further, the surface of the titanium nitride is naturally oxidized in a state of a layer containing lots of oxygen atoms. The electric resistance of the titanium nitride film is increased by the oxygen atoms remained in the titanium nitride film. Also, interfacial characteristics between the titanium nitride film and the capacitor insulating film, etc, formed thereon are changed and device characteristics are deteriorated.

Further, when the upper electrode and the lower electrode of the DRAM are formed by the titanium nitride film, the metal oxide film, etc, being the capacitor insulating film, is formed after the titanium nitride film, being the lower electrode, is formed. However, when the metal oxide film is formed, the titanium nitride film, being the lower electrode, is oxidized, and the device characteristics are deteriorated in some cases.

SUMMARY OF THE INVENTION

An object of the present invention is to provide a substrate processing apparatus capable of reducing residues of chlorine atoms and oxygen atoms in a metal nitride film, and improving oxidation resistance of the metal nitride film, in a temperature range of not deteriorating the characteristics of other film adjacent to the metal nitride film, and a manufacturing method of a semiconductor device.

According to an aspect of the present invention, a substrate processing apparatus is provided, comprising:

a processing chamber into which a substrate is loaded, having thereon a thin film containing oxygen atoms, chlorine atoms, and metal atoms;

a substrate support part for supporting and heating the substrate in the processing chamber;

a gas supply part for supplying nitrogen atoms-containing gas and hydrogen atoms-containing gas into the processing chamber;

a gas exhaust part for exhausting inside of the processing chamber;

a plasma generation part for exciting the nitrogen atoms-containing gas and the hydrogen atoms-containing gas supplied into the processing chamber; and a control part for controlling the substrate support part, the gas supply part, and the plasma generation part.

According to other aspect of the present invention, a manufacturing method of a semiconductor device is provided, comprising the steps of:

loading a substrate containing oxygen atoms, chlorine atoms, and metal atoms into a processing chamber so as to be supported by a substrate support part;

heating the substrate by the substrate support part;

exhausting inside of the processing chamber by a gas exhaust part while supplying nitrogen atoms-containing gas and hydrogen atoms-containing gas into the processing chamber by a gas supply part; and exciting the nitrogen atoms-containing gas and the hydrogen atoms-containing gas supplied into the processing chamber by a plasma generation part.

According to, the substrate processing apparatus and the manufacturing method of the semiconductor device according to the present invention, residual amounts of chlorine atoms and oxygen atoms in a metal nitride film can be reduced and oxidation resistance of the metal nitride film can be improved, in a temperature range of not deteriorating the characteristics of other film adjacent to the metal nitride film.

DETAILED DESCRIPTION OF THE INVENTION

As described above, when high heat treatment is applied to a titanium nitride film at for example 750° C. or more, the characteristics of other film adjacent to the titanium nitride film are deteriorated, thus increasing a leak current of a capacitor of DRAM in some cases. Further, diffusion occurs in a source region and a drain region which are previously formed in a substrate, thus deteriorating circuit characteristics and reducing performance of a semiconductor device in some cases. Meanwhile, when chlorine atoms are removed in a temperature range of not deteriorating the characteristics of the film adjacent to the titanium nitride film, it is difficult to sufficiently remove residual chlorine.

Therefore, inventors of the present invention performs strenuous efforts regarding a method of reducing residual amounts of chlorine and oxygen in a titanium nitride film and improving oxidation resistance of the titanium nitride film, in a temperature range of not deteriorating the characteristics of other film adjacent to the titanium nitride film. As a result, knowledge that the aforementioned problem can be solved is obtained, by plasma-activating the gas obtained by mixing hydrogen atoms-containing gas into nitrogen atoms-containing gas, and supplying the activated gas to the titanium nitride film formed on the substrate. The present invention is the invention achieved based on the aforementioned knowledge obtained by the inventors of the present invention. An embodiment of the present invention will be described hereafter.

(1) Structure of the Substrate Processing Apparatus

Figure 1:
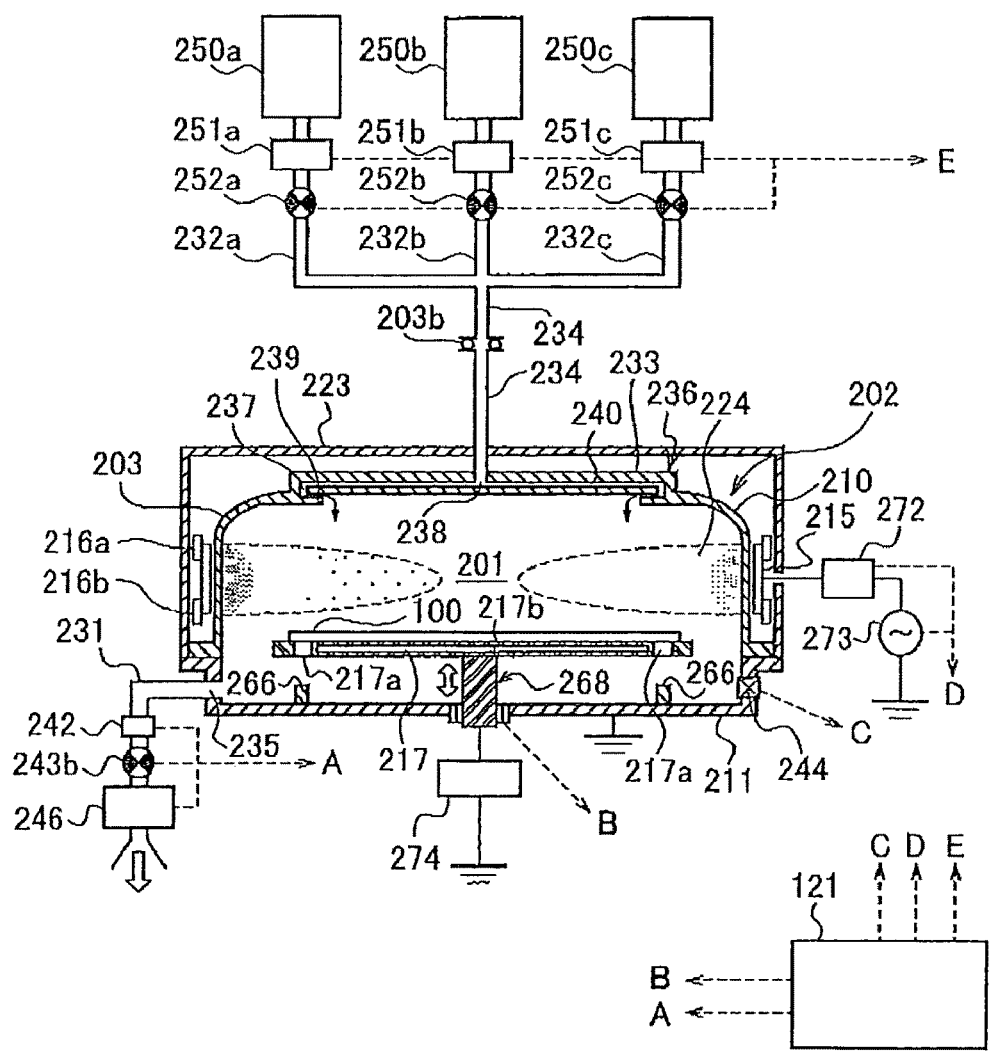
FIG. 1 is a cross-sectional schematic view of a substrate processing apparatus that executes a manufacturing method of a semiconductor device according to an embodiment of the present invention.

First, a constitutional example of the substrate processing apparatus that executes the manufacturing method of the semiconductor device according to this embodiment will be described by using FIG. 1. FIG. 1 is a cross-sectional block diagram of a MMT apparatus, being the substrate processing apparatus. The MMT apparatus is an apparatus for plasma-processing a silicon substrate 100 such as a silicon wafer by using a modified magnetron typed plasma source capable of generating high density plasma by an electric field and a magnetic field.

The MMT apparatus includes a processing furnace 202 for plasma-processing the silicon substrate 100. The processing furnace 202 includes a processing vessel 203 that constitutes a processing chamber 201; a susceptor 217; a gate valve 244; a shower head 236; a gas exhaust port 235; a cylindrical electrode 215; an upper magnet 216a; a lower magnet 216b; and a controller 121.

The processing vessel 203 that constitutes the processing chamber 201 includes a dome-type upper side vessel 210, being a first vessel, and a bowl-type lower side vessel 211, being a second vessel. The processing chamber 201 is formed by covering the lower side vessel 211 by the upper side vessel 210. The upper side vessel 210 is made of a non-metal material such as aluminium oxide ($Al_2O_3$) or quartz ($SiO_2$), and the lower side vessel 211 is made of, for example, aluminium (Al).

The susceptor 217 for supporting the silicon substrate 100 is disposed in a bottom-side central part within the processing chamber 201. The susceptor 217 is made of the non-metal material such as aluminium nitride (AlN), or ceramics, so that metal contamination of the film formed on the silicon substrate 100 can be reduced.

A heater 217b, being a heating mechanism, is integrally embedded in the susceptor 217, so that the silicon substrate 100 can be heated. For example, when electric power is supplied to the heater 217b, the surface of the silicon substrate 100 can be heated up to about 200° C.-750° C.

The substrate support part according to this embodiment is mainly constituted of the susceptor 217 and the heater 217b.

The susceptor 217 is electrically insulated from the lower side vessel 211. A second electrode (not shown), being an electrode for varying an impedance, is installed inside of the susceptor 217. The second electrode is installed through an impedance variable mechanism 274. The impedance variable mechanism 274 includes a coil and a variable capacitor, and by controlling the number of patterns of the coil and a capacity value of the variable capacitor, electric potential of the silicon substrate 100 can be controlled through the second electrode (not shown) and the susceptor 217.

An elevation mechanism 268 for elevating the susceptor 217 is provided to the susceptor 217. Through holes 217a are provided to the susceptor 217. Wafer push-up pins 266 for pushing-up the silicon substrate 100 are provided to at least three places on the bottom surface of the lower side vessel 211. The through holes 217a and the wafer push-up pins 266 are mutually disposed, so that when the susceptor 217 is lowered by the susceptor elevation mechanism 268, the wafer push-up pins 266 are passed through the through holes 217a in a non-contact state with the susceptor 217.

A gate valve 244, being a separation valve, is provided to a side wall of the lower side vessel 211. When the gate valve 244 is opened, the silicon substrate 100 is loaded into the processing chamber 201 or the silicon substrate 100 is unloaded to outside of the processing chamber 201, by using a transfer mechanism (not shown). By closing the gate valve 244, inside of the processing chamber 201 can be air-tightly closed.

A shower head 236 for supplying gas into the processing chamber 201 is provided in an upper part of the processing chamber 201. The shower head 236 includes a lid member 233 on a cap; a gas inlet port 234; a buffer chamber 237; an opening 238; a shielding plate 240; and a gas outlet port 239.

A lower stream end of a gas supply tube 232 for supplying gas into the buffer chamber 237 is connected to the gas inlet port 234 through an O-ring 203b, being a sealing member. The buffer chamber 237 functions as a dispersion space for dispersing the gas which is introduced from the gas inlet port 234.

The lower stream end of a nitrogen gas supply tube 232a for supplying $N_2$ gas, being nitrogen-containing gas, the lower stream end of a hydrogen gas supply tube 232b for supplying $H_2$ gas, being hydrogen-containing gas, and the lower stream end of rare gas supply tube 232c for supplying rare gas such as helium (He) and argon (Ar), being rare gas, are connected to the upstream side of the gas supply tube 234 so as to be joined together.

A nitrogen gas cylinder 250a, a mass flow controller 251a, being a flow rate control device, and a valve 252a, being an open/close valve, are sequentially connected to the gas supply tube 232a from the upstream side. A hydrogen gas cylinder 250b, a mass flow controller 251b, being the flow rate control device, and a valve 252b, being the open/close valve, are sequentially connected to the hydrogen gas supply tube 232b from the upstream side. A rare gas cylinder 250c, a mass flow controller 251c, being the flow rate control device, and a valve 252c, being the open/close valve, are sequentially connected to the rare gas supply tube 232c from the upstream side.

A gas supply part according to this embodiment is mainly constituted of the gas supply tube 234, nitrogen gas supply tube 232a, hydrogen gas supply tube 232b, rare gas supply tube 232c, nitrogen gas cylinder 250a, hydrogen gas cylinder 250b, rare gas cylinder 250c, mass flow controllers 251a to 252c, and valves 252a to 252c. The gas supply tube 234, nitrogen gas supply tube 232a, hydrogen gas supply tube 232b, rare gas supply tube 232c are made of, for example, a non-metal material such as quartz or aluminium oxide and a metal material such as SUS. $N_2$ gas, $H_2$ gas, and rare gas can be freely supplied into the processing chamber 201 through the buffer chamber 237 by opening and closing such valves 252a to 252c, while controlling the flow rate by the mass flow controllers 251a to 252c.

Here, explanation is given for a case that the gas cylinder is provided for every $N_2$ gas, $H_2$ gas, and rare gas. However, the present invention is not limited thereto, and an ammonia ($NH_3$) gas cylinder may be provided instead of the nitrogen gas cylinder 250a and the hydrogen gas cylinder 250b. Further, in a case of increasing the ratio of the nitrogen in a reaction gas, which is supplied into the processing chamber 201, the $N_2$ gas cylinder is further provided and the $N_2$ gas may be added to the $NH_3$ gas.

The gas exhaust port 235 for exhausting the reaction gas, etc, from the processing chamber 201, is provided in a lower part of the side wall of the lower side vessel 211. An upstream end of the gas exhaust tube 231 for exhausting gas is connected to the gas exhaust port 235. APC 242, being a pressure adjuster, a valve 243b, being the open/close valve, and a vacuum pump 246, being an exhaust device, are sequentially provided from the upstream side. The gas exhaust part according to this embodiment is mainly constituted of the gas exhaust port 235, gas exhaust tube 231, APC 242, valve 243b, and vacuum pump 246. The inside of the processing chamber 201 can be exhausted by operating the vacuum pump 246 and opening the valve 243b. Further, a pressure value inside of the processing chamber 201 can be adjusted by adjusting an opening degree of the APC 242.

A cylindrical electrode 215, being a first electrode, is provided on an outer periphery of the processing vessel 203 (upper side vessel 210) so as to surround a plasma generation region 224 in the processing chamber 201. The cylindrical electrode 215 is formed into a columnar shape such as a cylindrical shape. The cylindrical electrode 215 is connected to a high frequency electric power source 273 that generates high frequency electric power through a matching box 272 that performs impedance matching. The cylindrical electrode 215 functions as a discharge mechanism for exciting gas supplied into the processing chamber 201 and generating plasma.

An upper magnet 216a and a lower magnet 216b are respectively attached to upper/lower ends of an outside surface of the cylindrical electrode 215. The upper magnet 216a and the lower magnet 216b are respectively constituted as a permanent magnet, for example, formed into a ring shape.

The upper magnet 216a and the lower magnet 216b have magnetic poles respectively on both ends (namely inner peripheral end and outer peripheral end of each magnet) along a radius direction of the processing chamber 201. Directions of the upper magnet 216a and the lower magnet 216b are arranged so as to be opposite to each other. Namely, magnetic poles of the inner peripheral parts of the upper magnet 216a and the lower magnet 216b are different from each other. Thus, a magnetic line in a cylindrical axial direction is formed along an inner side surface of the cylindrical electrode 215.

A plasma generation part according to this embodiment is mainly constituted of the cylindrical electrode 215, matching box 272, high frequency electric power source 273, upper magnet 216a, and lower magnet 216b. A magnetron discharge plasma is generated in the processing chamber 201, by forming an electric field by supplying high frequency electric power to the cylindrical electrode 215 and forming a magnetic field by using the upper magnet 216a and the lower magnet 216b, after the mixed gas of $N_2$ gas and $H_2$ gas is introduced into the processing chamber 201. At this time, circulating motion of emitted electron is caused by the aforementioned electromagnetic field, thus increasing an ionizing ratio of plasma, and therefore high density plasma of long service life can be generated.

In addition, a metal shielding plate 223 for effectively shielding the electromagnetic field is provided around the cylindrical electrode 215, upper magnet 216a, and lower magnet 216b, so that the electromagnetic field formed thereby does not have an adverse influence on an outer environment and a device such as a processing furnace.

Further, the controller 121, being a control part, controls the APC 242, valve 243b, and vacuum pump 246 through a signal line A, controls the susceptor elevation mechanism 268 through a signal line B, controls the gate valve 244 through a signal line C, controls the matching box 272 and the high frequency electric power source 273 through a signal line D, mass flow controllers 251a to 252c and valves 252a to 252c through a signal line E, and further controls a heater embedded in the susceptor and an impedance variable mechanism 274 through a signal line not shown.

(2) Substrate Processing Step

Subsequently, explanation will be given for the substrate processing step executed as one step of the semiconductor manufacturing steps according to this embodiment. This step is executed by the aforementioned MMT apparatus, being the substrate processing apparatus. Note that in the explanation given hereafter, an operation of each part constituting the MMT apparatus is controlled by the controller 121. Here, explanation will be given for an example of applying nitriding treatment to a metal nitride film (titanium nitride film) formed as the lower electrode of a capacitor, by using plasma.

(Loading of the Substrate)

First, the susceptor 217 is lowered to a transfer position of the silicon substrate 100, and the wafer push-up pins 266 are passed through the through holes 217a of the susceptor 217. As a result, the push-up pins 266 are set in a state of protruding from the surface of the susceptor 217 by a prescribe height.

Subsequently, the gate valve 244 is opened, and the silicon substrate 100 is loaded into the processing chamber 201 by using the transfer mechanism not shown.

As a result, the silicon substrate 100 is supported in a horizontal posture on the wafer push-up pins 266 protruded from the surface of the susceptor 217. In addition, a titanium nitride film, being the lower electrode of the capacitor, is previously formed on the silicon substrate 100 by a CVD method or an ALD method. The titanium nitride film is formed by using titanium tetrachloride ($TiCl_4$) gas containing chlorine as a precursor gas, by other CVD apparatus and ALD apparatus not shown. Note that chlorine atoms are remained in the titanium nitride film, because the titanium tetrachloride ($TiCl_4$) gas is used as the precursor gas. Further, a natural oxide film is formed on the surface of the titanium nitride film. The natural oxide film is formed when the silicon substrate 100 is transferred into the processing chamber 201 from the CVD apparatus and the ALD apparatus.

When the silicon substrate 100 is loaded into the processing chamber 201, the transfer mechanism is retreated to outside the processing chamber 201, then the gate valve 244 is closed to air-tightly close the inside of the processing chamber 201. Then, the susceptor 217 is elevated by using the susceptor elevation mechanism 268. As a result, the silicon substrate 100 is disposed on an upper surface of the susceptor 217. Thereafter, the susceptor 217 is elevated to a prescribed position, and the silicon substrate 100 is elevated to a prescribed processing position.

When the silicon substrate 100 is loaded into the processing chamber 201, preferably either $N_2$ gas or rare gas, or both $N_2$ gas and rare gas, being inert gas, are supplied into the processing chamber 201 from a gas supply line, to fill the inside of the processing chamber 201 with the inert gas, while exhausting the inside of the processing chamber 201 by a gas exhaust line, and oxygen concentration is reduced. Namely, preferably by operating the vacuum pump 246 and opening the valve 243b, and by opening the valve 243a or the valve 243c while exhausting the inside of the processing chamber 201, the inert gas is supplied into the processing chamber 201 through the buffer chamber 237.

(Temperature Increase of the Substrate)

Subsequently, electric power is supplied to a heater 217h embedded in the susceptor 217, to heat the surface of the silicon substrate 100. A surface temperature of the silicon substrate 100 is set to 200° C. or more and under 750° C., and preferably set to 200° C. or more and 700° C. or less.

In the heat treatment applied to the silicon substrate 100, when the surface temperature is increased to 750° C. or more, diffusion occurs in the source region and the drain region formed in the silicon substrate 100, thus deteriorating circuit characteristics and reducing the performance of the semiconductor device in some cases. By controlling the temperature of the silicon substrate 100 as described above, diffusion of impurities in the source region and the drain region formed in the silicon substrate 100, deterioration of the circuit characteristics, and reduction of the performance of the semiconductor device can be suppressed. In the explanation hereafter, the surface temperature of the silicon substrate 100 is set to 450° C. for example.

(Introduction of the Reaction Gas)

Here, explanation will be given for a case that the mixed gas of $N_2$ gas and $H_2$ gas is used as the reaction gas.

First, valves 252a and 252b are opened and the reaction gas, being the mixed gas of $N_2$ gas and $H_2$ gas, is introduced (supplied) into the processing chamber 201 through the buffer chamber 237. At this time, opening degrees of the mass flow controllers 251a and 251b are respectively adjusted, so that the flow rate of the $N_2$ gas contained in the reaction gas and the flow rate of the $H_2$ gas contained in the reaction gas are set to be prescribed flow rates. The flow rate of the $H_2$ gas supplied into the processing chamber 201 falls within a range of more than 0 sccm and less than 600 sccm. Also, the flow rate of the $N_2$ gas supplied into the processing chamber 201 falls within a range of more than 0 sccm and less than 600 sccm.

Note that at this time, the concentration of the mixed gas of the $N_2$ gas and $H_2$ gas supplied into the processing chamber 201 may be adjusted by opening the valve 252c and supplying the rare gas, being diluted gas, into the processing chamber 201.

The percentage of the nitrogen atoms contained in the gas supplied into the processing chamber 201 falls within a range of more than 0% and less than 100%.

Further, after the reaction gas is started to be introduced into the processing chamber 201, the pressure in the processing chamber 201 is adjusted within 0.1 to 300 Pa, and for example is set to be 30 Pa, by using the vacuum pump 246 and the APC 242.

(Excitation of the Reaction Gas)

After the reaction gas is started to be introduced, high frequency electric power is applied to the cylindrical electrode 215 through the matching box 272 from the high frequency electric power source 273, and magnetic force from the upper magnet 216a and the lower magnet 216b is applied into the processing chamber 201, to thereby cause magnetron discharge to be generated in the processing chamber 201. As a result, high density plasma is generated in the plasma generation region 224 in the upper part of the silicon substrate 100. The electric power applied to the cylindrical electrode 215 falls within a range of 100 to 1000 W, and for example is set to be 800 W. The impedance variable mechanism 274 at this time is controlled in advance, to have a desired impedance value.

As described above, by setting the inside of the processing chamber in a plasma state, the $N_2$ gas and the $H_2$ gas supplied thereinto are excited and activated. Then, generated nitrogen radical (N*) and hydrogen radical (H*) are reacted with the surface of the silicon substrate 100. In this reaction, reduction by hydrogen, and collision of nitrogen atoms against the surface of the titanium nitride film and replenishment are carried out. As a result, chlorine components and hydrogen are reacted to generate a hydrogen chloride gas, and oxygen components and hydrogen are reacted to generate moisture ($H_2O$) gas. The hydrogen chloride gas and the moisture gas are then discharged to outside of the titanium nitride film. Then, nitrogen atoms are further introduced into the titanium nitride film, and the titanium nitride film is formed with higher bonding strength. A chemical formula in this reaction is shown below.

$$TiCl + N^* + H^* \rightarrow TiN + HCl \uparrow \quad \text{(Formula 1)}$$

$$TiO + N^* + 2H^* \rightarrow TiN + H_2O \uparrow \quad \text{(Formula 2)}$$

(Exhaust of Residual Gas)

When the nitriding treatment of the titanium nitride film is ended, supply of the electric power to the cylindrical electrode 215 is stopped and the valves 252a and 252b are closed to stop the supply of the gas into the processing chamber 201. Then, the residual gas in the processing chamber 201 is exhausted by using the gas exhaust tube 231. Then, the susceptor 217 is lowered to the transfer position of the silicon substrate 100, and the silicon substrate 100 is supported on the wafer push-up pins 266 protruded from the surface of the susceptor 217. Then, the gate valve 244 is opened, and the silicon substrate 100 is unloaded to outside of the processing chamber 201 by using the transfer mechanism not shown, and the substrate processing step according to this embodiment is ended.

(3) Effect of This Embodiment

According to this embodiment, one or a plurality of effects are exhibited as shown below.

(a) According to this embodiment, residual amounts of the chlorine atoms in the titanium nitride film can be reduced, then the quality of the titanium nitride film can be improved, and an electric resistance of the titanium nitride film can be reduced.

Figure 2:
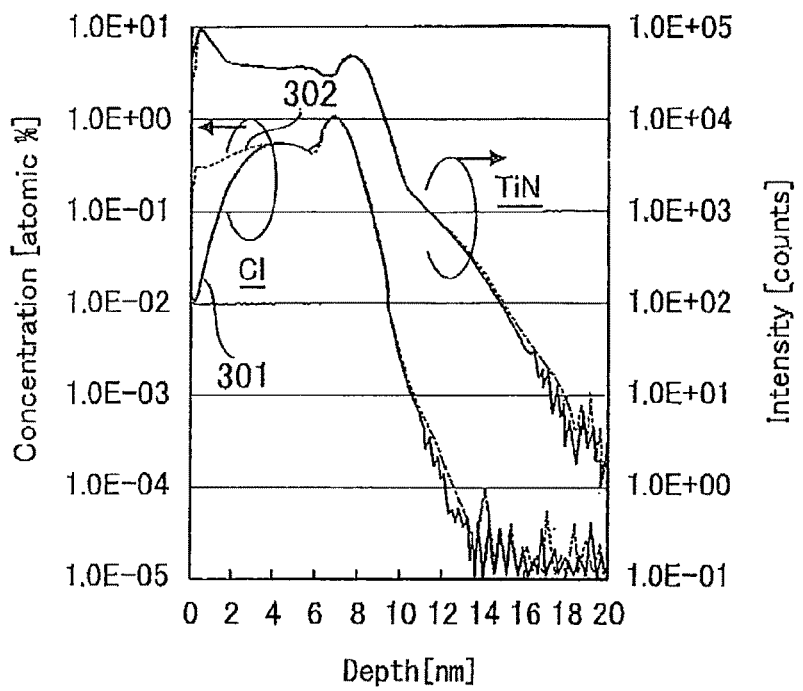
FIG. 2 is a graph showing concentration of chlorine atoms in a titanium nitride film.

FIG. 2 is a graph showing the concentration of the chlorine atoms in the titanium nitride film before/after the substrate processing step. Chlorine atom density (atomic %) in the titanium nitride film is taken on the vertical axis, and depth (nm) from the surface of the titanium nitride film is taken on the horizontal axis. According to FIG. 2, it is found that the chlorine atom density is decreased from the surface to the depth of about 4 nm of the titanium nitride film. Namely, it is found that the residual amounts of the chlorine atoms in the titanium nitride film can be reduced by executing the substrate processing step.

(b) According to this embodiment, the residual amounts of the oxygen atoms in the titanium nitride film can be reduced and the electric resistance of the titanium nitride film can be reduced. Further, introduction of the nitrogen atoms to the titanium nitride film is accelerated, and a bonding strength of the titanium nitride film can be increased, and the electric resistance of the titanium nitride film can be reduced.

Figures 5, 6:
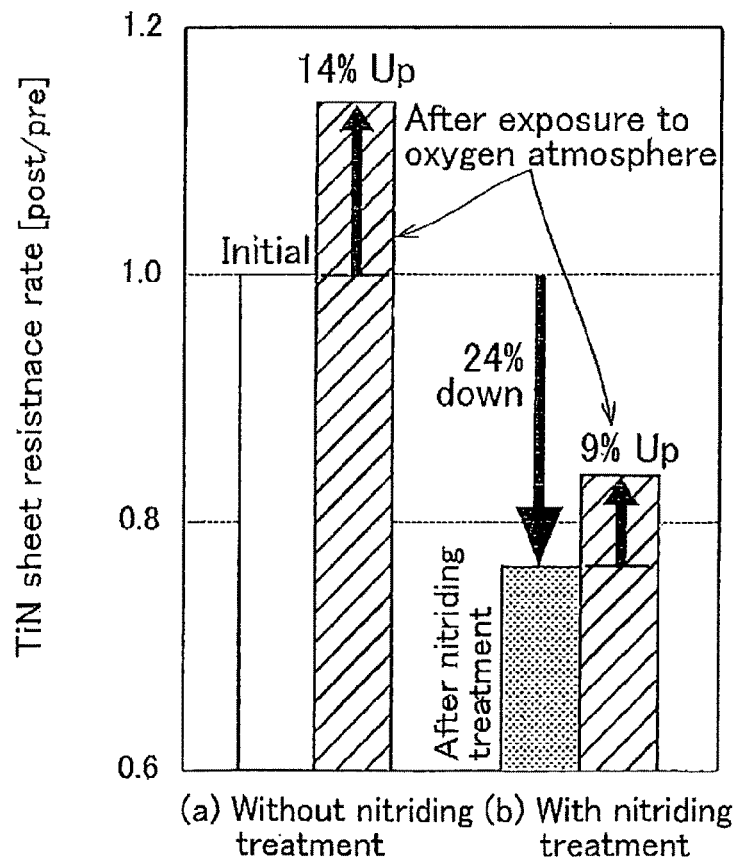
FIG. 5 is a table showing a composition ratio of the titanium nitride film.
FIG. 6 is a graph showing the variation of the sheet resistance of the titanium nitride film when exposed to oxygen atmosphere.

FIG. 5 shows results of evaluating a composition ratio of the titanium nitride film before/after the substrate processing step, by using an X-ray photoelectron spectroscopy. In this measurement, the composition at the depth of about 4 nm from the surface of the titanium nitride film is analyzed. According to FIG. 5, it is found that the composition ratio of the oxygen atoms is reduced and the composition ratio of the nitrogen atoms and the titanium atoms are respectively increased. Namely, by executing the substrate processing step, the oxygen atoms in the titanium nitride film is removed and the nitrogen atoms are introduced into the titanium nitride film, then nitriding of the titanium nitride film is accelerated, and the titanium nitride film with higher bonding strength is formed. Further, it is found that the residual amounts of carbon atoms can be reduced.

(c) According to this embodiment, the substrate processing step is performed at a temperature of 200° C. or more and under 750° C. (called a processing temperature region hereafter), and preferably at a temperature of 200° C. or more and 700° C. or less. Thus, the electric resistance of the titanium nitride film can be reduced and the characteristic can be improved.

Figure 3:
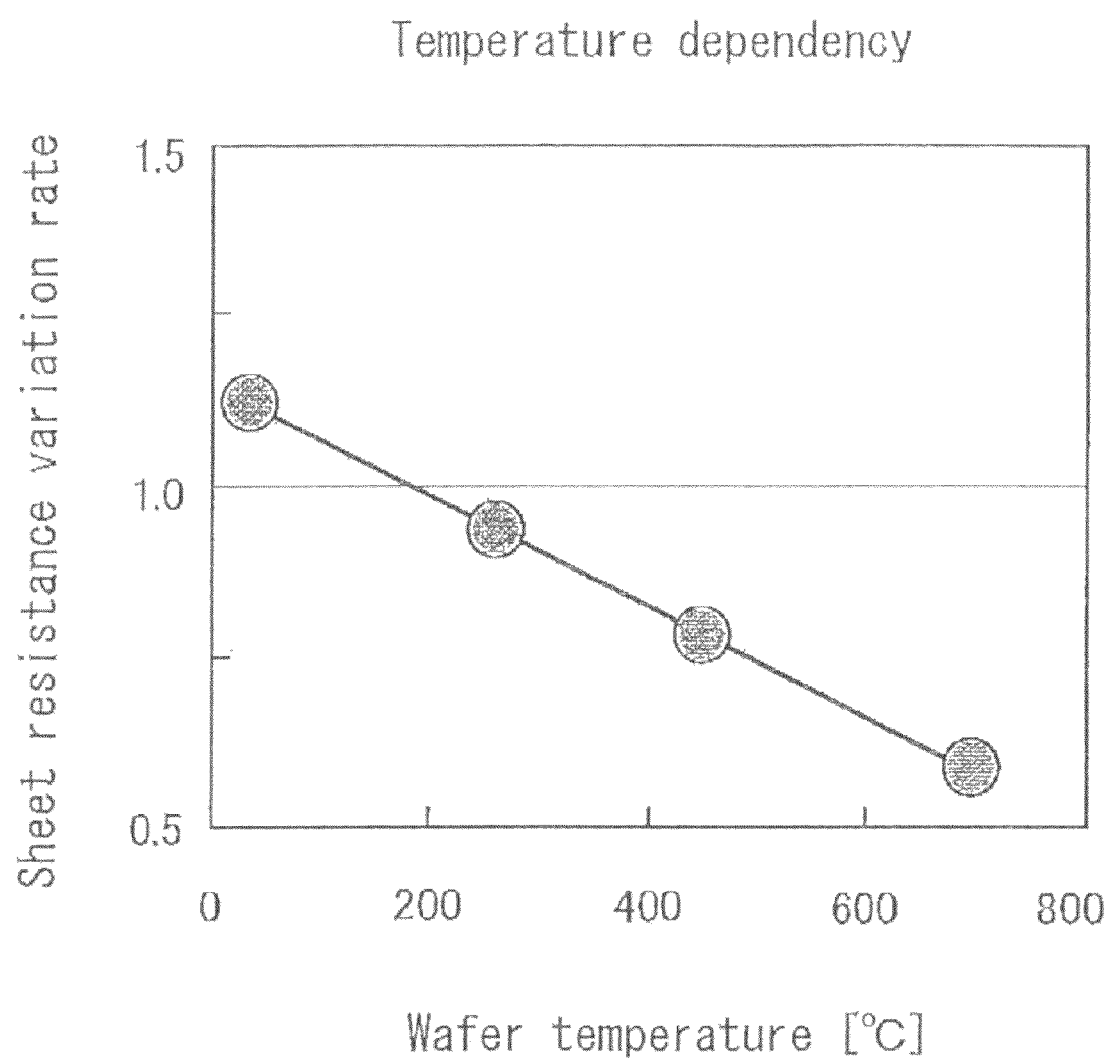
FIG. 3 is a graph showing temperature dependency of a sheet resistance of the titanium nitride film.

FIG. 3 is a graph showing temperature dependency of a sheet resistance of the titanium nitride film when the substrate processing is executed at a temperature including the aforementioned processing temperature region. FIG. 3 shows the ratio of the sheet resistance (sheet resistance variation rate) of the titanium nitride film after the substrate processing step is executed, with the sheet resistance (Ω/square) of the titanium nitride film set as 1 (criteria) before the substrate processing step is executed. The processing temperature (surface temperature of the silicon substrate 100) is set to be in a range of a room temperature to 700° C., and plasma processing is performed by using the mixed gas of $N_2$ gas and $H_2$ gas. According to FIG. 3, it is found that when the processing temperature is set to 200° C. or more, the sheet resistance variation rate is 1 or less. This shows that a film quality is improved, as the processing temperature is set to be higher like 200° C. or more. However, when the substrate is processed at 750° C. or more, there is a problem that the performance of the semiconductor device formed on the silicon substrate 100 is deteriorated. This problem is generated when diffusion occurs in the source region and the drain region and the circuit characteristics are deteriorated. Therefore, in this processing, the processing temperature is preferably set to 200° C. or more and under 750° C.

Figure 4:
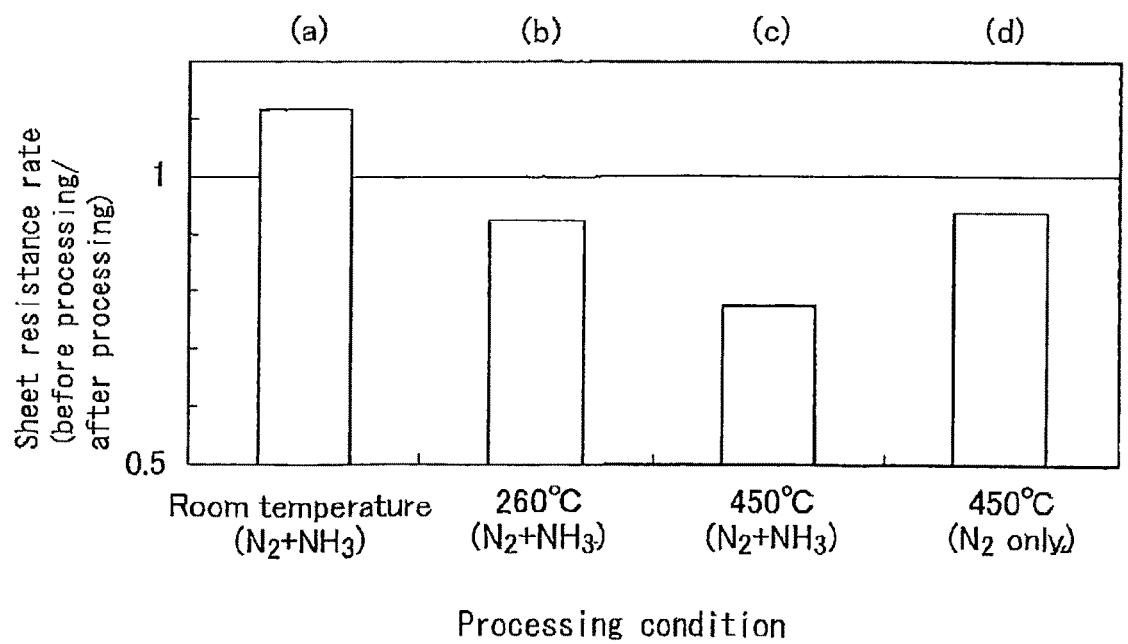
FIG. 4 is a graph showing a variation of the sheet resistance of the titanium nitride film.

FIG. 4 is a graph showing the variation of the sheet resistance of the titanium nitride film when the substrate processing step is executed. FIG. 4 shows the ratio of the sheet resistance (sheet resistance rate) of the titanium nitride film after the substrate processing step is executed, with the sheet resistance (Ω/square) of the titanium nitride film set as 1 (criteria) before the substrate processing step is executed. In FIG. 4 (a), the processing temperature (surface temperature of the silicon substrate 100) is set to be a room temperature and plasma processing is applied to the substrate by using the mixed gas of $N_2$ gas and $NH_3$ gas In FIG. 4 (b), the processing temperature is set to 260°, and plasma processing is applied to the substrate by using the mixed gas of $N_2$ gas and $NH_3$ gas. In FIG. 4 (c), the processing temperature is set to 450° C., and plasma processing is applied to the substrate by using the mixed gas of $N_2$ gas and $NH_3$ gas. In FIG. 4 (d), the processing temperature is set to 450° C., and plasma processing is applied to the substrate by using only $N_2$ gas.

According to FIG. 4, when the processing temperature is set in the processing temperature region (in a case of FIG. 4 (b) to FIG. 4 (d)), it is found that in any case, the sheet resistance can be reduced by executing the substrate processing step. Meanwhile, when the processing temperature is set to be a room temperature (in a case of FIG. 4 (a)), it is found that the sheet resistance is increased by executing the plasma processing.

In addition, as shown in FIG. 4 (b), it is found that an effect can, be obtained, which is equivalent or more of the effect of FIG. 4 (d) wherein the processing temperature is set to 450° C. in atmosphere of only $N_2$ gas. This is because the removal of the chlorine atoms remained in the titanium nitride film are accelerated by the hydrogen components contained in the $NH_3$ gas.

Further, as shown in FIG. 4 (c), it is found that the sheet resistance rate can be further effectively reduced by using the mixed gas of $N_2$ gas and $NH_3$ gas as the reaction gas, and increasing the processing temperature to 450° C. Namely, it is found that the removal of the chlorine atoms from the silicon nitride film can be accelerated by increasing the processing temperature. However, such a high temperature processing needs to be performed in a temperature range which does not deteriorate the characteristics of other film adjacent to the titanium nitride film (namely, temperature of 200° C. or more and under 750° C. (processing temperature region), and preferably in a range of 200° C. or more and 700° C. or less).

(d) According to this embodiment, oxidation resistance of the titanium nitride film can be improved. Thus, natural oxidation of the titanium nitride film can be suppressed and electric resistance of the titanium nitride film can be reduced. Further, when a metal oxide film, etc, being a capacitor insulating film, is formed on the titanium nitride film, being the lower electrode of DRAM by using an oxidizing agent such as $O_2$ and $O_3$, oxidation of the titanium nitride film by the oxidizing agent can be suppressed and interface characteristics can be improved.

FIG. 6 is a graph showing the variation of the sheet resistance of the titanium nitride film when exposed to oxygen ($O_2$) atmosphere. Note that exposure to the oxygen ($O_2$) atmosphere was performed for 120 seconds, with $O_2$ gas atmosphere and gas pressure set to 200 Pa, and wafer temperature set to 450° C. FIG. 6 (a) shows the variation of the sheet resistance rate of the titanium nitride film to which the substrate processing step is not executed, and FIG. 6 (b) shows the variation of the sheet resistance rate of the titanium nitride film to which the substrate processing step is executed. In either case of them, the substrate processing step is not executed, and a sheet resistance value of the titanium nitride film before being exposed to oxygen atmosphere is set to 1 (criteria).

As shown in FIG. 6, it is found that the sheet resistance of the titanium nitride film can be reduced by 24%, by executing the substrate processing step. Then, it is found that although the sheet resistance of the titanium nitride film is respectively increased by being exposed to the oxygen atmosphere, increase of the sheet resistance is suppressed in the titanium nitride film to which the substrate processing step is executed, compared with the titanium nitride film to which the substrate processing step is not executed. Namely, it is found that in the titanium nitride film to which the substrate processing step is not executed, the increase of the sheet resistance value is 14%, and meanwhile, in the titanium nitride film to which the substrate processing step is executed, the increase of the sheet resistance value is suppressed to 9%. Thus, it is found that the oxidation resistance of the titanium nitride film can be improved by executing the substrate processing step.

(e) According to this embodiment, high density plasma is generated in the vicinity of the silicon substrate 100, namely, in the plasma generation region 224 in an upper part of the silicon substrate 100, and nitrogen radical (N*) and hydrogen radical (H*) are generated in the processing chamber 201. Thus, the generated radical can be efficiently supplied to the titanium nitride film before being inactivated. Then, a processing speed of the substrate processing (nitriding treatment using plasma) can be improved. Note that in a remote plasma system for generating radical by generating plasma outside of the processing chamber 201, the generated radical is easily inactivated before being supplied to the silicon substrate 100, and it is difficult to efficiently supply the radical to the silicon substrate 100.

<Other Embodiment of the Present Invention>

As described above, embodiments of the present invention has been specifically described. However, the present invention is not limited thereto, and can be variously modified in a range not departing from the gist of the invention.

For example, in the aforementioned embodiment, explanation is given for a case of processing the silicon substrate 100 having the titanium nitride film formed on the surface. However, the present invention is not limited thereto, and similar processing can be executed to other substrate containing the chlorine atoms and metal atoms, such as a glass substrate having the titanium nitride film formed on the surface.

Further, for example, in the aforementioned embodiment, explanation is given for a case of using the mixed gas of $H_2$ gas and $N_2$ gas as the reaction gas. However, the present invention is not limited thereto. Depending on various conditions such as quantity of chlorine remained in the titanium nitride film, processing temperature, processing pressure, and supply flow rate, gases such as a single $NH_3$ gas, mixed gas of the $NH_3$ gas and $H_2$ gas, mixed gas of the $NH_3$ gas and $N_2$ gas, a single $N_2$ gas, monomethyl hydrazine ($CH_6N_2$) gas, or gas obtained by mixing such gases at an arbitrary ratio, can be used as the reaction gas.

Further, in the aforementioned embodiment, explanation is given, with a natural oxide film taken as an example, which is an oxide film formed on the substrate. However, the oxide film is not limited thereto. For example, the natural oxide film may be removed before the substrate is moved to the main apparatus. In this case, since there is no natural oxide film on the surface of the substrate, the oxygen atoms mixed into the substrate can be surely removed.

<Preferred Aspect of the Present Invention>

Preferred aspect of the present invention will be additionally described hereafter.

<Additional Description 1>

According to an aspect of the present invention, a substrate processing apparatus is provided, comprising:

a processing chamber into which a substrate is loaded, having thereon a substrate containing oxygen atoms, chlorine atoms, and metal atoms;

a substrate support part for supporting and heating the substrate in the processing chamber;

a gas supply part for supplying nitrogen atoms-containing gas and hydrogen atoms-containing gas into the processing chamber;

a gas exhaust part for exhausting inside of the processing chamber;

a plasma generation part for exciting the nitrogen atoms-containing gas and the hydrogen atoms-containing gas supplied into the processing chamber; and a control part for controlling the substrate support part, the gas supply part, and the plasma generation part.

<Additional Description 2>

Preferably, a natural oxide film and a metal nitride film containing the chlorine atoms and metal atoms are formed on the loaded substrate according to the additional description 1.

<Additional Description 3>

Preferably, the metal atoms are titanium.

<Additional Description 4>

Further preferably, the metal nitride film is a film containing titanium nitride.

<Additional Description 5>

Further preferably, the plasma generation part is provided so as to generate plasma in the processing chamber.

<Additional Description 6>

Further preferably, the nitrogen atoms-containing gas is any one of nitrogen gas, ammonia gas, and monomethyl hydrazine gas, and the hydrogen atoms-containing gas is any one of hydrogen gas, ammonia gas, and monomethyl hydrazine gas.

<Additional Description 7>

Further preferably, the percentage of nitrogen atoms contained in a gas supplied into the processing chamber is within a range of more than 0% and less than 100%.

<Additional Description 8>

According to other aspect of the present invention, a manufacturing method of a semiconductor device is provided, comprising the steps of:

loading a substrate containing oxygen atoms, chlorine atoms, and metal atoms into a processing chamber so as to be supported by a substrate support part;

heating the substrate by the substrate support part;

exhausting inside of the processing chamber by a gas exhaust part while supplying nitrogen atoms-containing gas and hydrogen atoms-containing gas into the processing chamber by a gas supply part; and exciting the nitrogen atoms-containing gas and the hydrogen atoms-containing gas supplied into the processing chamber by a plasma generation part.

<Additional Description 9>

According to further other aspect of the present invention, a manufacturing method of a semiconductor device is provided, comprising the steps of:

loading a substrate containing oxygen atoms, chlorine atoms, and metal atoms into a processing chamber;

processing the substrate in the processing chamber, by a reaction gas containing nitrogen atoms in an excitation state; and unloading the substrate from the processing chamber.

<Additional Description 10>

Preferably, hydrogen atoms are contained in the reaction gas.

<Additional Description 11>

Further preferably, the metal film is a titanium-containing film.

<Additional Description 12>

Further preferably, the reaction gas is a mixed gas of ammonia gas, or nitrogen components and ammonia components.

<Additional Description 13>

Further preferably, the reaction gas is diluted with rare gas.

<Additional Description 14>

According to further other aspect of the present invention, a substrate processing apparatus is provided, comprising:

a processing chamber into which a substrate having a metal film containing oxygen atoms and chlorine atoms is loaded;

a gas supply part for supplying reaction gas into the processing chamber;

a plasma generation part for exciting the reaction gas in the processing chamber; and a control part for controlling the gas supply part and the plasma generation part, so that the substrate is processed by the reaction gas containing nitrogen atoms in an excitation state.

This U.S. non-provisional patent application claims priority under 35 U.S.C.§119 of Japanese Patent Application No. 2009-139198, filed on Jun. 10, 2009, and No. 2010-131794, filed on Jun. 9, 2010, in the Japanese Patent Office, the entire contents of which are hereby incorporated by reference.

What is claimed is:

1. A manufacturing method of a semiconductor device, comprising the steps of:
    loading a substrate on which a film containing oxygen atoms, chlorine atoms, and metal atoms is formed into a processing chamber so as to be supported by a substrate support part;
    heating the substrate by the substrate support part;
    exhausting inside of the processing chamber by a gas exhaust part while supplying nitrogen atoms-containing gas and hydrogen atoms-containing gas into the processing chamber by a gas supply part; and
    exciting the nitrogen atoms-containing gas and the hydrogen atoms-containing gas supplied into the processing chamber by a plasma generation part.

2. The manufacturing method according to claim 1, wherein the metal atoms are titanium.

3. The manufacturing method according to claim 2, wherein the film is a nitride film.

4. The manufacturing method according to claim 2, wherein a natural oxide film is formed on the film.

5. The manufacturing method according to claim 2, wherein the film is a lower electrode of a capacitor.

6. The manufacturing method according to claim 1, wherein the plasma generation part is provided so as to generate plasma in the processing chamber.

7. The manufacturing method according to claim 1, wherein
    the nitrogen atoms-containing gas is any one of nitrogen gas, ammonia gas, and monomethyl hydrazine gas; and
    hydrogen atoms-containing gas is any one of hydrogen gas, ammonia gas, and monomethyl hydrazine gas.

8. The manufacturing method according to claim 1, wherein the film is a nitride film.

9. The manufacturing method according to claim 8, wherein a natural oxide film is formed on the film.

10. The manufacturing method according to claim 8, wherein the nitride film is a lower electrode of a capacitor, and a natural oxide film is formed on the nitride film.

11. The manufacturing method according to claim 1, wherein a natural oxide film is formed on the film.

12. The manufacturing method according to claim 1, wherein the film is a lower electrode of a capacitor.

13. The manufacturing method according to claim 12, wherein a natural oxide film is formed on the film.

14. The manufacturing method according to claim 1, wherein in heating the substrate, the substrate is heated to a temperature of 200° C. or more and under 750° C.

15. The manufacturing method according to claim 1, wherein in heating the substrate, the substrate is heated to a temperature of 200° C. or more and 700° C. or less.

* * * * *